(12) United States Patent
Sasaki

(10) Patent No.: US 7,034,495 B2
(45) Date of Patent: Apr. 25, 2006

(54) INDICATING INSTRUMENT

(75) Inventor: Kiyoshi Sasaki, Tokyo (JP)

(73) Assignee: Calsonic Kansei Corporation, Tokyo (JP)

( * ) Notice: Subject to any disclaimer, the term of this patent is extended or adjusted under 35 U.S.C. 154(b) by 0 days.

(21) Appl. No.: 10/974,788

(22) Filed: Oct. 28, 2004

(65) Prior Publication Data

US 2005/0093503 A1 May 5, 2005

(30) Foreign Application Priority Data

Oct. 29, 2003 (JP) ............................ 2003-368216
Sep. 21, 2004 (JP) ............................ 2004-272995

(51) Int. Cl.
*G01R 1/20* (2006.01)
*H02P 37/12* (2006.01)
*H02P 8/00* (2006.01)

(52) U.S. Cl. .................... 318/685; 318/696; 116/62.1; 116/47; 116/288; 73/1.88

(58) Field of Classification Search ................ 318/685, 318/696, 599, 603; 116/62.1, 47, 284–288, 116/DIG. 6, DIG. 35, DIG. 36; 324/139, 324/143, 144, 151 R; 702/142; 73/1.37, 73/1.88
See application file for complete search history.

(56) References Cited

U.S. PATENT DOCUMENTS

| 4,567,434 A | * | 1/1986 | Lindig ........................ 324/160 |
| 4,868,508 A | * | 9/1989 | Ohishi ........................ 324/525 |
| 5,032,781 A | * | 7/1991 | Kronenberg ................ 318/696 |
| 5,055,782 A | * | 10/1991 | Kronenberg ........... 324/207.25 |
| 5,223,791 A | * | 6/1993 | Umehara ..................... 324/146 |
| 5,287,050 A | * | 2/1994 | Kronenberg et al. ........ 318/696 |
| 5,333,371 A | * | 8/1994 | Mittenbuhler et al. ........ 29/595 |
| 5,847,531 A | * | 12/1998 | Hoffsommer et al. ....... 318/696 |
| 5,900,711 A | * | 5/1999 | Senoo ........................ 318/696 |
| 6,014,075 A | * | 1/2000 | Fujimori et al. ............. 340/461 |
| 6,356,046 B1 | * | 3/2002 | Koumura et al. ........... 318/696 |
| 6,519,999 B1 | * | 2/2003 | Komura et al. .............. 73/1.88 |
| 6,624,608 B1 | * | 9/2003 | Komura ...................... 318/696 |
| 6,680,597 B1 | * | 1/2004 | Catellani et al. ............ 318/696 |
| 6,771,038 B1 | * | 8/2004 | Fyfe ............................ 318/685 |
| 6,798,164 B1 | * | 9/2004 | Umehara et al. ............ 318/685 |
| 6,853,162 B1 | * | 2/2005 | Betts et al. .................. 318/696 |
| 6,956,351 B1 | * | 10/2005 | Yamada ...................... 318/685 |

FOREIGN PATENT DOCUMENTS

| JP | 2001-314099 A | 11/2001 |
| JP | 2002-250641 A | 9/2002 |

* cited by examiner

*Primary Examiner*—Marlon T. Fletcher
*Assistant Examiner*—Eduardo Colon Santana
(74) *Attorney, Agent, or Firm*—Foley & Lardner LLP

(57) ABSTRACT

An output port open control device (65) allows a port (P3) which outputs PWM signals of a Cos+ side to be in a high impedance state in a period in which respective PWM signals of Cos+ and Cos− supplied to a S-phase coil (22) of a stepping motor (2) are in a ground level, induced voltage corresponding to a magnetic flux variation caused in accordance with rotation of a magnet rotor (23) is generated in the S-phase coil (22), a voltage comparator (72) compares the induced voltage with a previously set threshold value and outputs presence or absence of the induced voltage, and a zero-reset judging device (66) determines that a pointer (4) is in the middle of rotation when the induced voltage is detected, and determines that the pointer (4) is in contact with a stopper mechanism (5) when it is not detected.

2 Claims, 7 Drawing Sheets

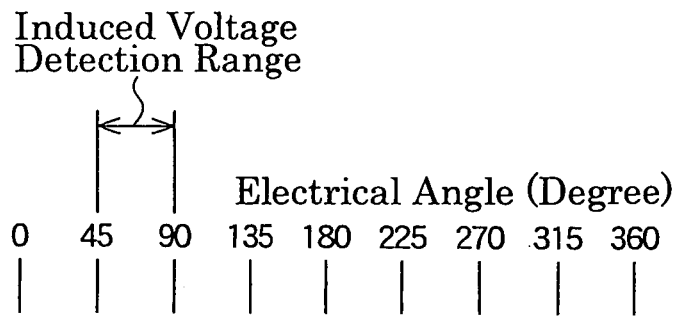
FIG.2A Sin+ 
FIG.2B Sin− 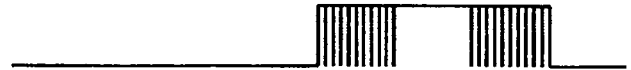
FIG.2C S-Phase Coil 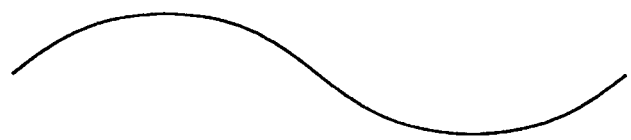
FIG.2D Cos+ 
FIG.2E Cos− 
FIG.2F C-Phase Coil 
⟶ Parting-Zero Direction of Pointer
⟵ Zero-Reset Direction of Pointer FIG.3A Induced Voltage
FIG.3B Induced Voltage (Filter Output)
FIG.3C Detection Output (Voltage Comparator Output)
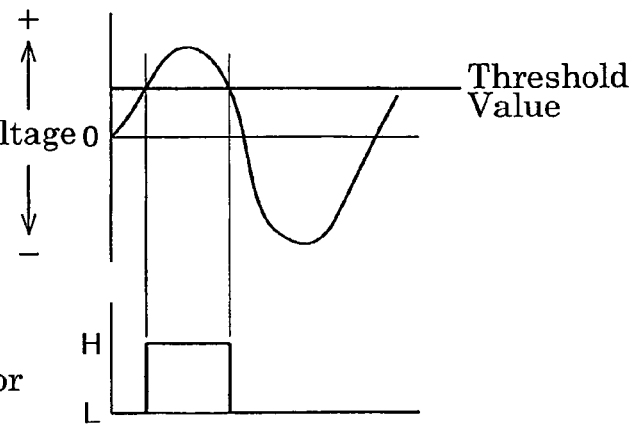

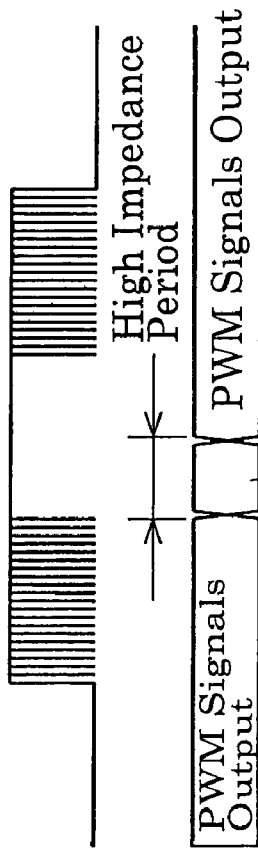
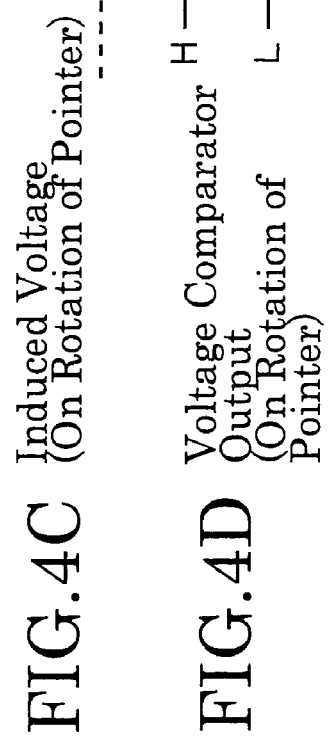
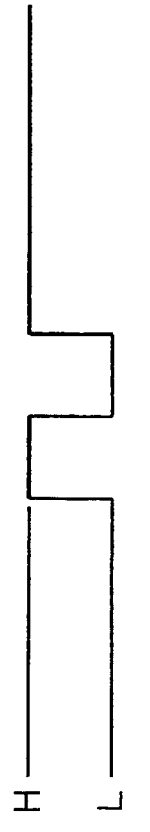
FIG.4A Sin+
FIG.4B Output Port
FIG.4C Induced Voltage (On Rotation of Pointer)
FIG.4D Voltage Comparator Output (On Rotation of Pointer)
FIG.4E Induced Voltage (Pointer Stopped)
FIG.4F Voltage Comparator Output (Pointer Stopped)

INDICATING INSTRUMENT

BACKGROUND OF THE INVENTION

1. Field of the Invention

The present invention relates to an indicating instrument which uses a stepping motor as a primary drive of a pointer.

2. Description of the Related Art

In an indicating instrument in which a stepping motor is used as a primary drive of a pointer, a reference position of the pointer is set by rotating the pointer toward a zero-reset position and stopping the pointer at the zero-reset position with a stopper mechanism, in order to carry out a step-out reset.

Induced voltage is generated in a field winding during when the pointer moves, i.e., when a magnet rotor of the stepping motor rotates. The induced voltage will not be generated in the field winding if the pointer stops at the zero-reset position and the rotation of the magnet rotor is stopped.

Given this factor, the field winding of the stepping motor is switched to a non-excited state during the course of driving the stepping motor with alternating current zero-reset voltage, and it is judged that the pointer has reached the zero-reset position when the induced voltage generated in the field winding becomes lower than voltage of a predetermined threshold value (for reference, see JP-A 2001-314099 and 2002-250641).

Conventionally, a switch circuit for switching the field winding to the non-excited state is provided to detect the induced voltage. In addition, in order to carry out zero-reset judgment (judgment that the pointer is in contact with the stopper mechanism) on the basis of the induced voltage by a CPU or the like, the induced voltage is loaded with a predetermined sampling period through an A/D converter, the loaded data of induced voltage is processed with an averaging process or the like, and thereafter, the threshold value is judged. Therefore, there have been problems that the number of circuit component is large and control becomes complicated.

SUMMARY OF THE INVENTION

The present invention has been made in view of the above-mentioned problems. Therefore, it is an object of the present invention to provide an indicating instrument in which circuits for detecting induced voltage and carrying out zero-reset judgment on the basis of the induced voltage are simplified.

To accomplish the above mentioned object, an indicating instrument according to a first aspect of the present invention comprises: a stepping motor having a magnet rotor and a stator provided with two field windings for rotating the magnet rotor; a PWM signal generating device for generating respective PWM signals of an artificial sine-wave and an artificial cosine-wave which are supplied to each of the field windings for rotating the magnet rotor; a pointer rotated in accordance with rotation of the magnet rotor; and a stopper mechanism for stopping rotation of the pointer when the pointer has returned to a zero-reset position, wherein the indicating instrument further comprises: an output port open control device for controlling an output port which outputs the PWM signals to either end of one of the field windings to be in an open state during a period in which the PWM signals supplied to the one of the field windings are in a ground level, at the time when the pointer is rotated to a zero-reset direction by supplying the respective PWM signals which are for rotating the pointer toward the zero-reset direction to each of the field windings; a voltage comparator for comparing magnitude of induced voltage induced in the one of the field windings and previously set threshold value voltage and generating an binary output; and a zero-reset judging device for judging whether the pointer is in the middle of the rotation or the pointer is in contact with the stopper mechanism and the rotation of the pointer is stopped, based on the binary output of the voltage comparator in a period in which the output port is controlled to be in the open state.

An indicating instrument according to a second aspect of the present invention comprises: a stepping motor having a magnet rotor and a stator provided with two field windings for rotating the magnet rotor; a PWM signal generating device for generating respective PWM signals of an artificial sine-wave and an artificial cosine-wave which are supplied to each of the field windings for rotating the magnet rotor; a pointer rotated in accordance with rotation of the magnet rotor; and a stopper mechanism for stopping rotation of the pointer when the pointer has returned to a zero-reset position, wherein the indicating instrument further comprises: an output port selecting/open connection control device for controlling an output port which outputs the PWM signals to either end of one of the field windings to be in an open state during a period in which the PWM signals supplied to the one of the field windings are in a ground level, and carrying out control in which the field windings of the output port are selectively connected to an induced voltage detecting circuit, at the time when the pointer is rotated to a zero-reset direction by supplying the respective PWM signals which are for rotating the pointer toward the zero-reset direction to each of the field windings; a selector for connecting the field winding selected by the output port selecting/open connection control device with the induced voltage detecting circuit; a voltage comparator provided in the induced voltage detecting circuit for comparing magnitude of induced voltage induced in the one of the field windings and previously set threshold value voltage and generating an binary output; and a zero-reset judging device for judging whether the pointer is in the middle of the rotation or the pointer is in contact with the stopper mechanism and the rotation of the pointer is stopped, based on the binary output of the voltage comparator in a period in which the output port is controlled to be in the open state.

BRIEF DESCRIPTION OF THE DRAWINGS

The above and other objects, features and advantages of the present invention will become more apparent from the following description taken in connection with the accompanying drawings, in which;

FIGS. 2A to 2F are explanatory diagrams of PWM signals according to the first embodiment, wherein FIG. 2A shows PWM signals Sin+ of a Sin+ side, FIG. 2B shows PWM signals Sin– of a Sin– side, FIG. 2C shows signals applied to a S-phase coil, FIG. 2D shows PWM signals Cos+ of a Cos+ side, FIG. 2E shows PWM signals Cos– of a Cos– side, and FIG. 2F shows signals applied to a C-phase coil;

FIGS. 3A to 3C are diagrams explaining operation of an induced voltage detecting circuit of the first embodiment, wherein FIG. 3A shows a wave pattern of induced voltage generated in the C-phase coil, FIG. 3B shows an output of a filter circuit, and FIG. 3C shows an output of a voltage comparator;

FIGS. 4A to 4F are timing charts of detection of the induced voltage of the first embodiment, wherein FIG. 4A shows the PWM signals Sin+ of the Sin+ side, FIG. 4B shows a period that an output port P3 is open, FIG. 4C shows the induced voltage when a pointer is in the middle of its rotation, FIG. 4D shows the output of the voltage comparator when the pointer is in the middle of its rotation, FIG. 4E shows the induced voltage when the pointer is stopped, and FIG. 4F shows the output of the voltage comparator when the pointer is stopped;

DESCRIPTION OF THE PREFERRED EMBODIMENTS

Hereinafter, the present invention will be described based on embodiments.

(First Embodiment)

Figure 1:
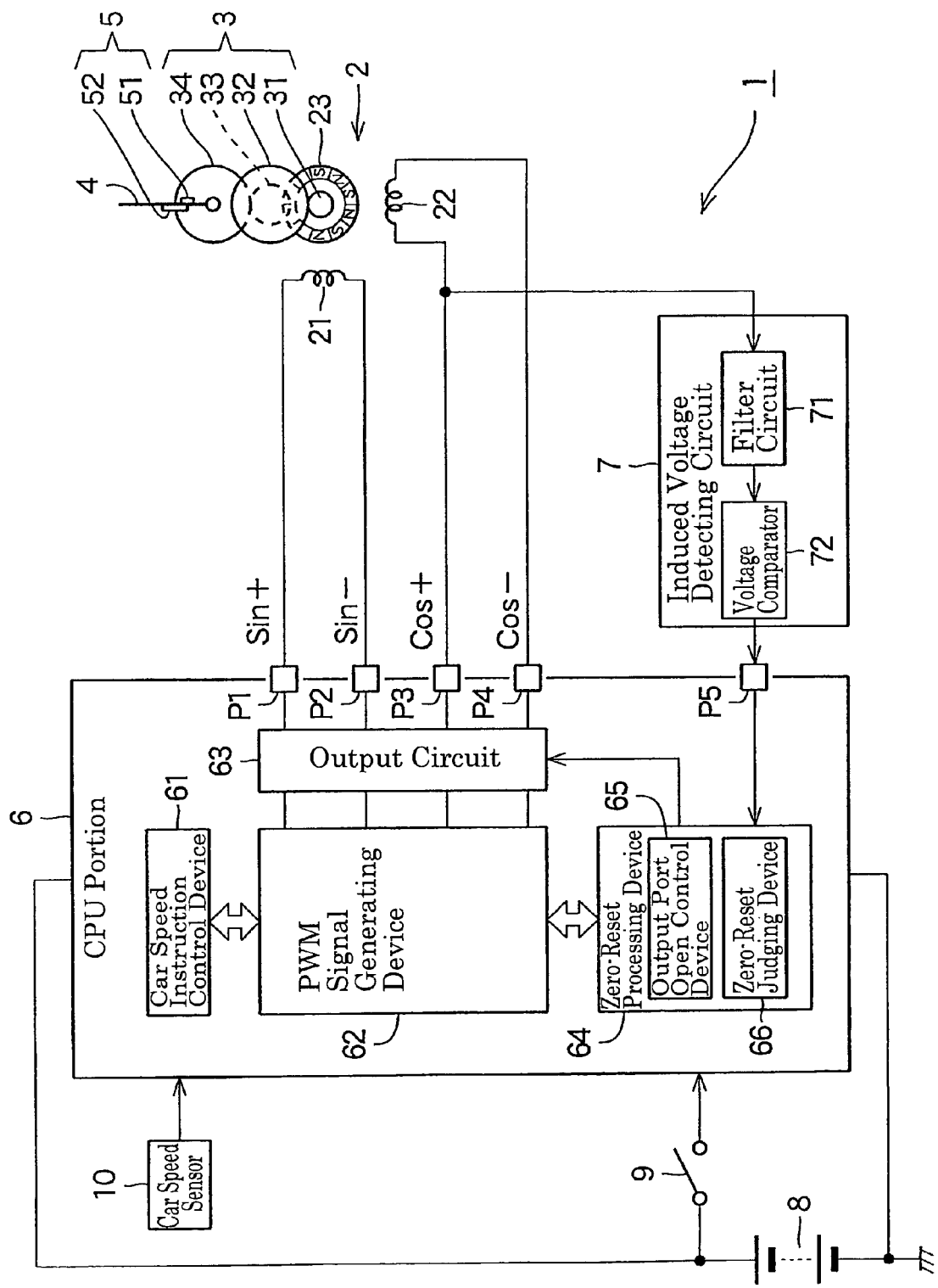
FIG. 1 is a diagram showing a frame format structure and a block structure of an indicating instrument according to a first embodiment of the present invention.

FIG. 1 is a diagram showing a frame format structure and a block structure of an indicating instrument according to a first embodiment of the present invention.

In the first embodiment, explanation on a speedometer (car speed meter) for a vehicle will be given as an indicating instrument. The indicating instrument 1 comprises a two-phase type stepping motor 2, a pointer 4 rotated through a reduction gear mechanism 3, a stopper mechanism 5 for stopping the rotation of the pointer 4, a CPU portion 6, and an induced voltage detecting circuit 7. The indicating instrument 1 is operated by receiving supply of power from a battery 8. The CPU portion 6 includes a power supply circuit or the like. The CPU portion 6 drives the stepping motor 2 based on an output of detection of a car speed sensor 10 when an ignition switch 9 is in an ON state, to rotate the pointer 4 to a position on a scale of a not-shown dial plate corresponding to a car speed.

The stepping motor 2 is provided with a stator (not shown) including an S-phase coil (field winding) 21 and a C-phase coil (field winding) 22, and a magnet rotor 23. A plurality of N-poles and S-poles are arranged and magnetized alternately at an outer circumference surface of the magnet rotor 23.

The reduction gear mechanism 3 is provided with an input-stage gear 31, a first intermediate gear 32, a second intermediate gear 33, and an output-stage gear 34. Rotation of the magnet rotor 23 is transmitted to the input-stage gear 31, and is transmitted to the output-stage gear 34 via each of the intermediate gears 32 and 33. The pointer 4 is rotated in accordance with rotation of the output-stage gear 34.

The stopper mechanism 5 is structured by a stopper member 51 attached to the output-stage gear 34, and a locking arm 52 for blocking the rotation of the pointer 4 toward a direction of zero-reset by contact of the stopper member 51.

Alternatively, the stopper mechanism 5 may be configured to block the rotation of the pointer 4 toward the zero-reset direction, by providing a projection on the dial plate which is not shown and thereby allowing the pointer 4 to be in contact with the projection. The rotation of each of the gears 31 to 34 and the magnet rotor 23 are also blocked in the state in which the rotation of the pointer 4 toward the zero-reset direction is blocked by the stopper mechanism 5.

The CPU portion 6 is structured by using a microcomputer system, and is provided with a car speed instruction control device 61, a PWM signal generating device 62, a PWM signals output circuit 63, and a zero-reset processing device 64, and so on. The car speed instruction control device 61 calculates a rotating direction and a rotating angle of the pointer 4 on the basis of car speed signals supplied from the car speed sensor 10 when the ignition switch 9 is in the ON state, drives the stepping motor 2 through the PWM signal generating device 62, and rotates the pointer 4 to the position on the scale of the not-shown dial plate corresponding to the car speed.

The PWM signal generating device 62 generates respective PWM signals of artificial sine-waves to be supplied to one end and the other end of the S-phase coil 21, and respective PWM signals of artificial cosine-waves to be supplied to one end and the other end of the C-phase coil 22. The four types of PWM signals generated by the PWM signal generating device 62 are supplied to respective output ports P1 to P4 through the output circuit 63.

In the output circuit 63, circuits in which a switching element such as a transistor for outputting voltage of a "high" level (power supply voltage level) and a switching element such as the transistor for outputting voltage of a "ground" level are connected in series with the power source, are provided corresponding to each of the output ports P1 to P4, respectively. The output circuit 63 is capable of allowing the output ports to be in an open (high impedance) state, by driving each of the switching elements to be in an off state, together.

In the present embodiment, PWM signals "Sin+" of a Sin+ side are outputted from the output port P1, which are supplied to one end of the S-phase coil 21. PWM signals "Sin−" of a Sin− side are outputted from the output port P2, which are supplied to the other end of the S-phase coil 21. PWM signals "Cos+" of a Cos+ side are outputted from the output port P3, which are supplied to one end of the C-phase coil 22. PWM signals "Cos−" of a Cos− side are outputted from the output port P4, which are supplied to the other end of the C-phase coil 22.

The zero-reset processing device 64 carries out a process in which the pointer 4 is returned to a zero (reference) position when the ignition switch 9 is operated to be "off" and when the ignition switch 9 is operated to be "on". The zero-reset processing device 64 includes an output port open control device 65 for controlling one end of the C-phase coil 22 to be in the open state, and a zero-reset judging device 66 which detects stopping of the rotation of the magnet rotor 23 on the basis of an output of the induced voltage detecting circuit 7 and thereby judges that the pointer 4 has returned to the zero (reference) position.

The induced voltage detecting circuit 7 is provided with a filter circuit 71 having a low-pass property for reducing or removing a high frequency noise element overlapped with the induced voltage induced in the C-phase coil 22, and a voltage comparator 72 which compares the induced voltage with a previously set threshold value voltage (for example, the voltage comparator compares magnitude of the induced voltage and the previously set threshold value) and generates a binary output. The binary output of the voltage comparator 72 is supplied to the zero-reset processing device 64 provided in the CPU portion 6 through an input port P5.

FIGS. 2A–2F are explanatory diagrams of the PWM signals, wherein FIG. 2A shows the PWM signals Sin+ of the Sin+ side, FIG. 2B shows the PWM signals Sin− of the Sin− side, and FIG. 2C shows signals applied to the S-phase coil 21. FIG. 2D shows the PWM signals Cos+ of the Cos+ side, FIG. 2E shows the PWM signals Cos− of the Cos− side, and FIG. 2F shows signals applied to the C-phase coil 22.

In the first embodiment, it is configured that the signals substantially in a sine-wave pattern are supplied to the S-phase coil 21 and the signals substantially in a cosine-wave pattern are supplied to the C-phase coil 22, by using three levels of periods, which are a period in which duty ratio is zero percent (period of "L" level), a period in which the duty ratio is 50% (period shown by pulses), and a period in which the duty ratio is 100% (period of "H" level).

In a case where the pointer 4 is to be rotated toward a parting-zero direction, each of the PWM signals are generated and outputted in such a manner as to be in a direction that a degree of an electrical angle shown in FIG. 2 increases, and in a case where the pointer 4 is to be rotated toward the zero-reset direction, each of the PWM signals are generated and outputted in such a manner as to be in a direction that the degree of the electrical angle shown in FIG. 2 decreases.

In the present embodiment, the detection of the induced voltage is carried out during the period in which each of the PWM signals Cos+ and Cos− of the C-phase side become in the "L" level (ground level), together, i.e., within a range from 90 degrees to 45 degrees of the electrical angle shown in FIGS. 2A to 2F. More specifically, the detection of the induced voltage is carried out within a range in which the electrical angle shown in FIGS. 2A to 2F is 90 degrees to 67.5 degrees.

The output port open control device 65 shown in FIG. 1 controls the output port P3 which outputs the PWM signals Cos+ to be in the high impedance at the time when the electrical angle shown in FIGS. 2A to 2F becomes 90 degrees. Thereby, one end of the C-phase coil 22 becomes in the open (opened) state. Since a magnetic flux variation is generated in accordance with a rotational speed of the magnet rotor 23 if the magnet rotor rotates, the induced voltage is generated in the C-phase coil 22 in accordance with the magnetic flux variation.

FIGS. 3A to 3C are diagrams explaining operation of the induced voltage detecting circuit, wherein FIG. 3A shows a wave pattern of the induced voltage generated in the C-phase coil 22, FIG. 3B shows an output of the filter circuit 71, and FIG. 3C shows the output of the voltage comparator 72. As shown in FIG. 3A, although there may be a case that the induced voltage is overlapped with the high frequency noise, this noise is removed by the filter circuit 71. The voltage comparator 72 compares the noise-removed induced voltage shown in FIG. 3B with the previously set threshold value voltage, and generates the output of "H" level during the period in which the induced voltage exceeds the threshold value voltage as shown in FIG. 3C.

FIGS. 4A to 4F are timing charts of the detection of the induced voltage, wherein FIG. 4A shows the PWM signals Sin+ of the Sin+ side, and FIG. 4B shows a period that the output port P3 is open. FIG. 4C shows the induced voltage when the pointer is in the middle of its rotation, and FIG. 4D shows the output of the voltage comparator when the pointer is in the middle of its rotation. FIG. 4E shows the induced voltage when the pointer is stopped, and FIG. 4F shows the output of the voltage comparator when the pointer is stopped.

In a state of driving the stepping motor 2 in such a manner as to rotate the pointer 4 toward the zero-reset direction and during when the electrical angle is within the range of 90 degrees to 67.5 degrees, the output port P3 is adapted to be in the high impedance state, and one end of the C-phase coil 22 is allowed to be in the open state. In the present embodiment, since the electrical angle of 45 degrees is driven by 2 milliseconds at the time when the zero-reset process of the pointer is carried out, time for allowing the output port P3 to be in the high impedance state is one millisecond.

A dotted line in FIGS. 4C and 4E represents the PWM signals Cos+ of the C-phase side, and the induced voltage is represented by a solid line. Although there may be temporarily generated transient voltage in the C-phase coil 22 caused in accordance with the opening of the output port P3, the induced voltage according to the magnetic flux variation occurring in accordance with the rotation of the magnet rotor 23 is generated, thereafter. As shown in FIG. 4C, the induced voltage according to the magnetic flux variation is generated in the state where the pointer is in the middle of returning to zero (zero-reset) and the magnet rotor 23 is rotated, but since that induced voltage exceeds the threshold value voltage, the output of the voltage comparator 72 is "H" level as shown in FIG. 4D.

The zero-reset judging device 66 shown in FIG. 1 loads the output of the voltage comparator 72 at the timing immediately before the opening of the output port P3 is stopped. Alternatively, the zero-reset judging device 66 may be configured to load the output of the voltage comparator 72 for several times at predetermined time intervals in latter half of the open period of the output port P3. The zero-reset judging device 66 judges that the pointer 4 is in the middle of its rotation when the output of the voltage comparator 72 is "H" level, and continues the zero-reset process.

The magnetic flux variation will not be generated in a state in which the rotation of the pointer is stopped by the stopper mechanism 5 and the rotation of the magnet rotor 23 is also stopped. Accordingly, since the induced voltage will not generate as shown in FIG. 4E, the output of the voltage comparator 72 is "L" level as shown in FIG. 4F.

The zero-reset judging device 66 shown in FIG. 1 loads the output of the voltage comparator 72 at the timing immediately before the opening of the output port P3 is stopped, and judges that the pointer 4 has returned to the zero-reset position when it is "L" level, and stops the driving of the stepping motor 2.

Figure 5:
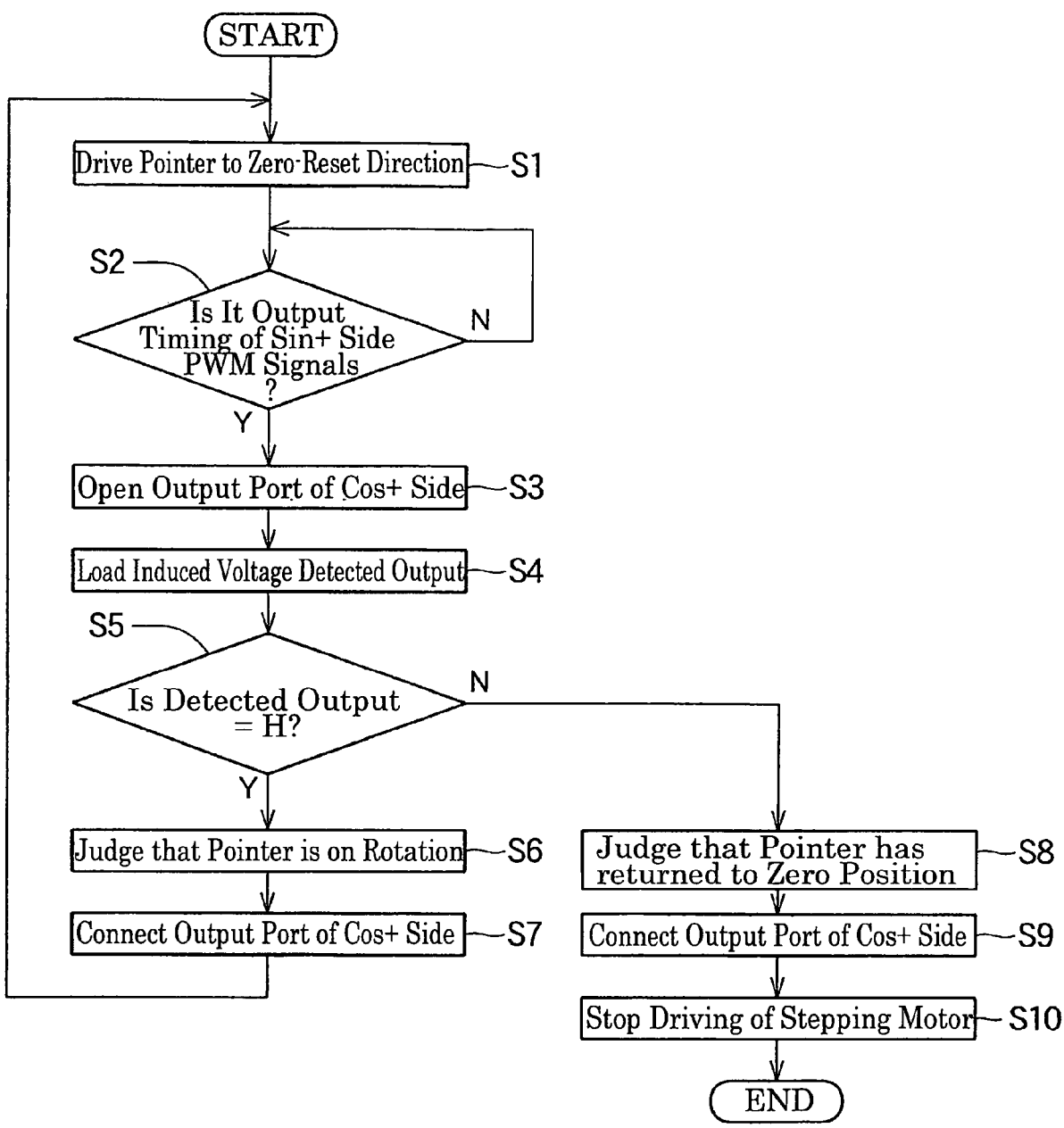
FIG. 5 is a flowchart showing a zero-reset process of the first embodiment.

FIG. 5 is a flowchart of the zero-reset process. The zero-reset processing device 64 drives the stepping motor 2 toward the direction to which the pointer 4 is returned (reset) to zero (step S1). Then, the output port P3 of the Cos+ side is allowed to be in the open (high impedance) state at the timing that the PWM signals in the Sin+ side are outputted (steps S2 and S3). An induced voltage detected output (the output of the voltage comparator 72) is loaded from the input port P5 (step S4), then it is judged that the pointer is in the middle of its rotation when a logic level of the output is "H" level (steps S5 and S6), the output port P3 of the Cos+ side is returned to an output state of the PWM signals (step S7), and the driving of the pointer toward the zero-reset direction is continued. When the induced voltage detected output (the output of the voltage comparator 72) is "L" level in the step S5, it is determined that the pointer has returned to the zero position (step S8), the output port P3 of the Cos+ side is returned to an output state of the PWM signals (step S9), and the driving of the stepping motor is stopped (step S10).

(Second Embodiment)

Figure 6:
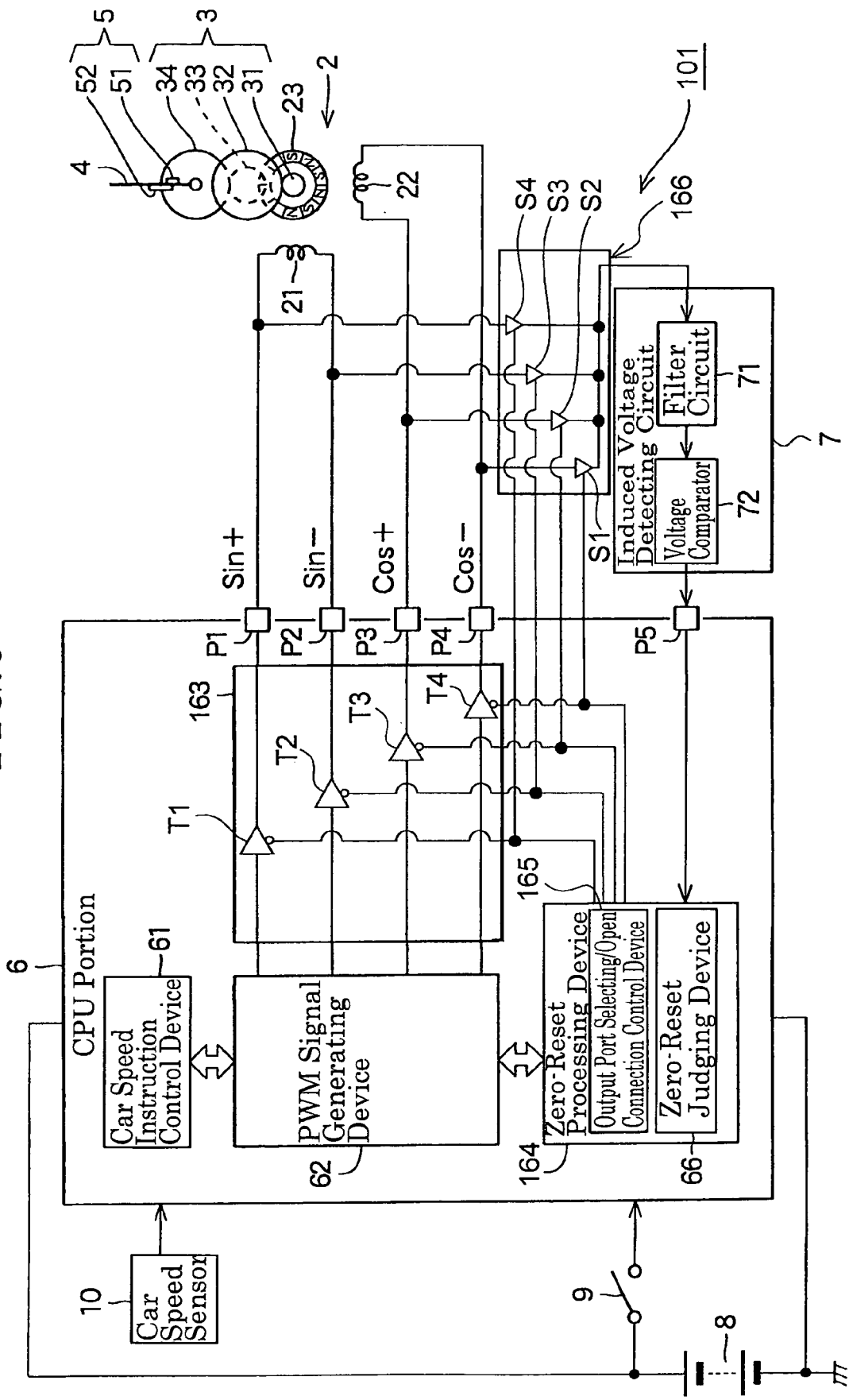
FIG. 6 is a diagram showing a frame format structure and a block structure of an indicating instrument according to a second embodiment of the present invention.

FIG. 6 shows an indicating instrument 101 according to the second embodiment of the present invention. Meanwhile, portions in the present embodiment, which are same or equivalent to the indicating instrument 1 of the first embodiment, will be explained by attaching same reference numerals used therein.

First, to explain mainly on structural differences, an output circuit 163 of the indicating instrument 101 according to the second embodiment includes switch circuits T1 to T4 in which a switching element such as the transistor for outputting the voltage of the "high" level (power supply voltage level) and a switching element such as the transistor for outputting the voltage of the "ground" level are connected in series with the power source, are provided corresponding to each of the output ports P1 to P4, respectively. The output circuit 163 is capable of allowing the output ports P1 to P4 to be in the open (high impedance) state, individually, by driving each of the switching elements to be in the off state, together.

Each of the switch circuits T1 to T4 are connected with an output port selecting/open connection control device (or output port open control device) 165 included in a zero-reset processing device 164, thereby it is possible to allow each of the output ports P1 to P4 to be in the open (high impedance) state, selectively.

Also, the output port selecting/open connection control device 165 is connected with a selector 166 which is interposed between one end or the other end of the S-phase coil 21 and the C-phase coil 22 and which has respective switching elements S1 to S4 provided corresponding to each of the switch circuits T1 to T4, thereby it is configured that control in which the field windings of the output ports P1 to P4 are selectively connected to the induced voltage detecting circuit 7 is carried out.

In addition, it is configured that the selector 166 connects one end of the S-phase coil 21 or the C-phase coil 22 of the output ports P1 to P4, selected by the output port selecting/open connection control device 165, with the induced voltage detecting circuit 7, and thereby, when the selected field winding is switched to a non-excited state, the detection of the induced voltage is immediately started.

Next, operation of the indicating instrument 101 according to the second embodiment will be described.

Figure 7:
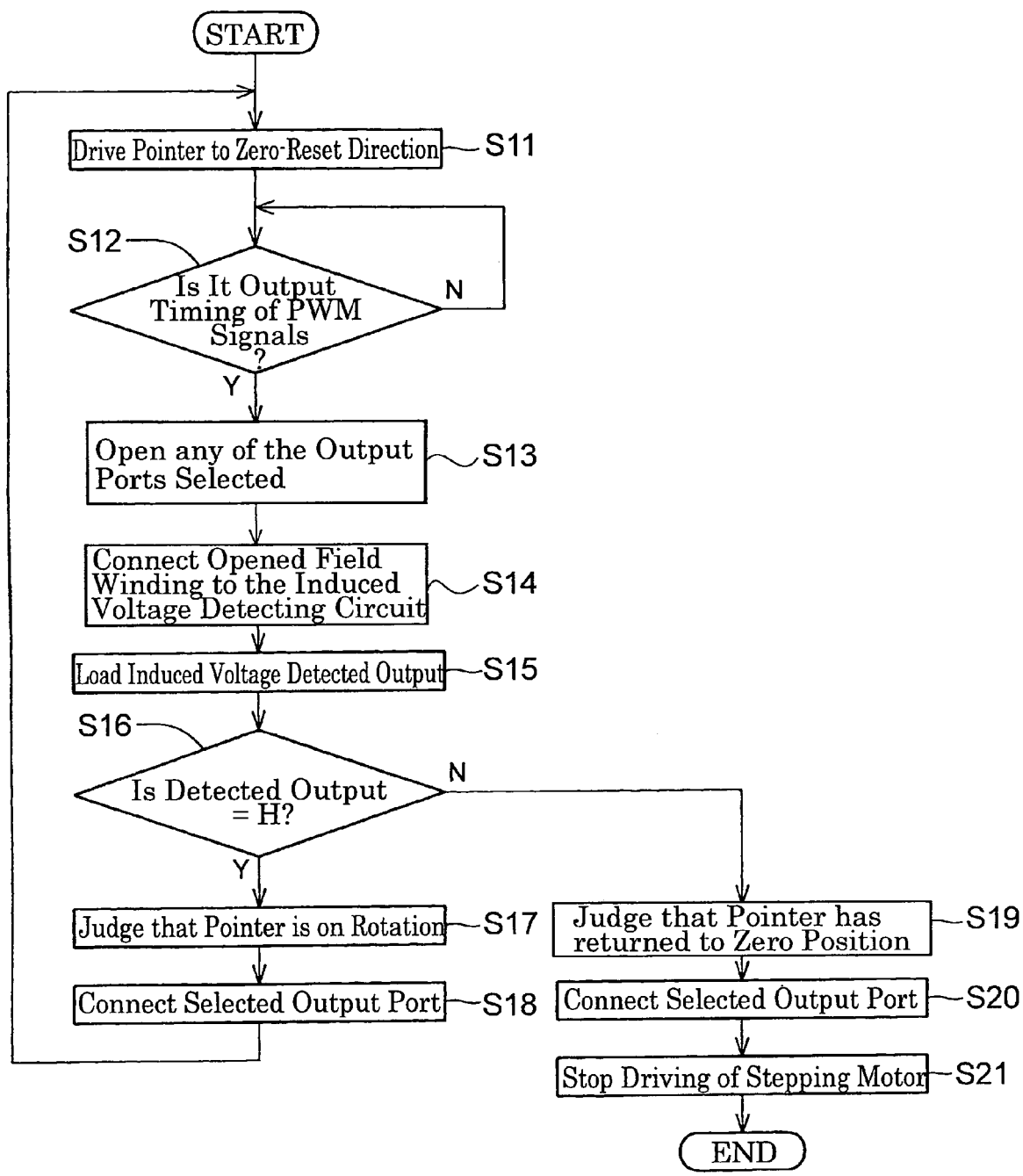
FIG. 7 is a flowchart showing a zero-reset process of the second embodiment.

To explain the operation of the indicating instrument 101 of the second embodiment in accordance with the flowchart of the zero-reset process shown in FIG. 7, the zero-reset processing device 164 drives the stepping motor 2 toward the direction to which the pointer 4 is returned (reset) to zero (step S11). Then, at the timing that the any of the PWM signals are outputted (steps S12), any of the output ports P1 to P4 selected is allowed to be in the open (high impedance) state (step S13), and at the same time, the opened field winding is connected to the induced voltage detecting circuit 7 (step S14).

Thereafter, the induced voltage detected output (the output of the voltage comparator 72) is loaded from the input port P5 (step S15), then it is judged that the pointer is in the middle of its rotation when the logic level of the output is "H" level (steps S16 and S17), the selected output port P1 to P4 is returned to the output state of the PWM signals (step S18), and the driving of the pointer toward the zero-reset direction is continued. When the induced voltage detected output (the output of the voltage comparator 72) is "L" level in the step S16, it is determined that the pointer has returned to the zero position (step S19), the selected output port P1 to P4 is returned to the output state of the PWM signals (step S20), and the driving of the stepping motor 2 is stopped (step S21).

According to the indicating instrument 101 of the second embodiment, in addition to the operation and effect of the first embodiment, the output ports P1 to P4, which output the PWM signals to one end or the other end of the S-phase coil 21 or the C-phase coil 22, are allowed to be in the open state (high impedance state), selectively, and at the same time, the respective switching elements S1 to S4 corresponding to each of the switch circuits T1 to T4 are switched over by the selector 166 such that the opened S-phase coil 21 or the C-phase coil 22 is utilized as the winding for detecting the induced voltage, and one end or the other end of the S-phase coil 21 or the C-phase coil 22 is connected to the induced voltage detecting circuit 7.

Accordingly, the S-phase coil 21 or the C-phase coil 22, which is same as the S-phase coil 21 or the C-phase coil 22 to be opened, is connected to the induced voltage detecting circuit 7, and the selected S-phase coil 21 or the C-phase coil 22 is switched over to the non-excited state and the detection of the induced voltage is immediately started.

Also, since the output ports P1 to P4 are opened during the period in which the PWM signals to be supplied to the S-phase coil 21 or the C-phase coil 22 are in the ground level, it is possible to detect the induced voltage without influencing control of the rotation of the magnet rotor 23.

Furthermore, since the level of the induced voltage is judged by using the voltage comparator 72, an A/D conversion process and so on is not necessary and a circuit structure is simplified.

Moreover, since it is possible to judge the level of the induced voltage similarly in any of the timings, it is possible to improve accuracy in the detection.

Other structures, operations and effects are same or equivalent to those of the first embodiment, so explanations thereof are therefore omitted.

Meanwhile, although the case where one end of the C-phase coil 22 is allowed to be in the open state and the C-phase coil 22 is utilized as the coil for detecting the induced voltage, such a configuration may be adopted wherein one end of the S-phase coil 21 is allowed to be in the open state and the induced voltage is detected by the S-phase coil 21. In such a case, one end of the S-phase coil 21 is made to be in the open state at the timing that the S-phase coil 21 becomes non-excited. Thereby, it is possible to detect whether the pointer 4 is in the middle of the rotation or in the stopped state by detecting the induced voltage, without influencing the driving of the stepping motor 2.

According to the indicating instrument of the first embodiment, the field winding is utilized as the winding for the detection of the induced voltage by allowing the output port which outputs the PWM signals to the field winding to be in the open state (high impedance state). Therefore, there is no need to separately provide a switch circuit for switching the field winding to the non-excited state, and the circuit structure is simplified. In addition, since the output port is opened during the period in which the PWM signals supplied to the field winding are in the ground level, it is possible to detect the induced voltage without influencing the rotation control of the magnet rotor. Furthermore, since the level of the induced voltage is judged by using the voltage comparator, the A/D conversion process and so on is not necessary and the circuit structure is simplified.

Also, according to the indicating instrument of the second embodiment, the output port which outputs the PWM signals to the field winding is allowed to be in the open state (high impedance state), and at the same time, the field winding is connected to the induced voltage detecting circuit, such that the opened field winding is utilized as the detecting winding of the induced voltage.

Accordingly, the field winding, which is same as the field winding to be opened, is connected to the induced voltage detecting circuit, and the selected field winding is switched over to the non-excited state and the detection of the induced voltage is immediately started.

Also, since the output port is opened during the period in which the PWM signals to be supplied to the field winding are in the ground level, it is possible to detect the induced voltage without influencing control of the rotation of the magnet rotor. In addition, since the level of the induced voltage is judged by using the voltage comparator, the A/D conversion process and so on is not necessary and the circuit structure is simplified.

Moreover, since it is possible to judge the level of the induced voltage similarly in any of the timings, it is possible to improve the detecting accuracy.

Although the invention has been described in its preferred form with a certain degree of particularity, obviously many changes and variations are possible therein. It is therefore to be understood that the present invention may be practiced otherwise than as specified herein without departing from the scope and spirit thereof.

What is claimed is:

1. An indicating instrument, comprising:
   a stepping motor having a magnet rotor and a stator provided with two field windings for rotating the magnet rotor;
   a PWM signal generating device for generating respective PWM signals of an artificial sine-wave and an artificial cosine-wave which are supplied to each of said field windings for rotating said magnet rotor;
   a pointer rotated in accordance with rotation of said magnet rotor; and
   a stopper mechanism for stopping rotation of the pointer when said pointer has returned to a zero-reset position,
   wherein the indicating instrument further comprises:
   an output port open control device for controlling an output port which outputs the PWM signals to either end of one of said field windings to be in an open state during a period in which the PWM signals supplied to said one of the field windings are in a ground level, at the time when the pointer is rotated to a zero-reset direction by supplying the respective PWM signals which are for rotating said pointer toward the zero-reset direction to each of said field windings;
   a voltage comparator for comparing magnitude of induced voltage induced in said one of the field windings and previously set threshold value voltage and generating an binary output; and
   a zero-reset judging device for judging whether said pointer is in the middle of the rotation or said pointer is in contact with said stopper mechanism and the rotation of said pointer is stopped, based on the binary output of said voltage comparator in a period in which said output port is controlled to be in the open state.

2. An indicating instrument, comprising:
   a stepping motor having a magnet rotor and a stator provided with two field windings for rotating the magnet rotor;
   a PWM signal generating device for generating respective PWM signals of an artificial sine-wave and an artificial cosine-wave which are supplied to each of said field windings for rotating said magnet rotor;
   a pointer rotated in accordance with rotation of said magnet rotor; and
   a stopper mechanism for stopping rotation of the pointer when said pointer has returned to a zero-reset position,
   wherein the indicating instrument further comprises:
   an output port selecting/open connection control device for controlling an output port which outputs the PWM signals to either end of one of said field windings to be in an open state during a period in which the PWM signals supplied to said one of the field windings are in a ground level, and carrying out control in which the field windings of the output port are selectively connected to an induced voltage detecting circuit, at the time when the pointer is rotated to a zero-reset direction by supplying the respective PWM signals which are for rotating said pointer toward the zero-reset direction to each of said field windings;
   a selector for connecting the field winding selected by said output port selecting/open connection control device with said induced voltage detecting circuit;
   a voltage comparator provided in said induced voltage detecting circuit for comparing magnitude of induced voltage induced in said one of the field windings and previously set threshold value voltage and generating an binary output; and
   a zero-reset judging device for judging whether said pointer is in the middle of the rotation or said pointer is in contact with said stopper mechanism and the rotation of said pointer is stopped, based on the binary output of said voltage comparator in a period in which said output port is controlled to be in the open state.

* * * * *